United States Patent [19]

Tsunooka et al.

[11] Patent Number: 4,675,123

[45] Date of Patent: Jun. 23, 1987

[54] PIEZOELECTRIC COMPOSITE MATERIAL

[75] Inventors: Tsutomu Tsunooka; Shigeo Saito; Takashi Yamamoto; Hiroshi, Ito, all of Aichi, Japan

[73] Assignee: NGK Spark Plug Co., Ltd., Nagoya, Japan

[21] Appl. No.: 722,199

[22] Filed: Apr. 11, 1985

Related U.S. Application Data

[63] Continuation of Ser. No. 112,493, Jan. 16, 1980, abandoned.

[30] Foreign Application Priority Data

Jan. 17, 1979 [JP] Japan .................................. 54-40931
Feb. 20, 1979 [JP] Japan .................................. 54-18702

[51] Int. Cl.$^4$ ...................... C04B 35/00; C04B 35/49
[52] U.S. Cl. .................................................. 252/62.9
[58] Field of Search ........................................ 252/62.9

[56] References Cited

U.S. PATENT DOCUMENTS

| | | | |
|---|---|---|---|
| 3,352,632 | 11/1967 | Sasaki ................................ | 252/62.9 |
| 3,708,438 | 1/1973 | Levy .................................. | 252/62.9 |
| 4,128,489 | 12/1978 | Seo .................................... | 252/62.9 |
| 4,152,281 | 5/1979 | Arendt et al. ...................... | 252/62.9 |

Primary Examiner—Jack Cooper
Attorney, Agent, or Firm—Sughrue, Mion, Zinn, Macpeak, and Seas

[57] ABSTRACT

A piezoelectric composite material having excellent piezoelectric property and workability, which is prepared by compounding in a specific mixing ratio a ferroelectric ceramic powder comprising microcrystals having uniform size and virtually a single domain and a polymer. The ceramic powder is obtained by preparing a ceramic having a desired composition by causing the appropriate mixture of starting powders to undergo a solid phase reaction, grinding the reaction product, annealing the resulting powder under heat and optionally chemically etching it.

22 Claims, 16 Drawing Figures

2μm　　X5000

2μm　　X5000

2μm　　X5000

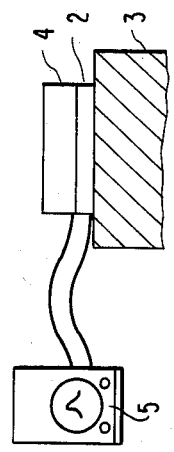
FIG.9
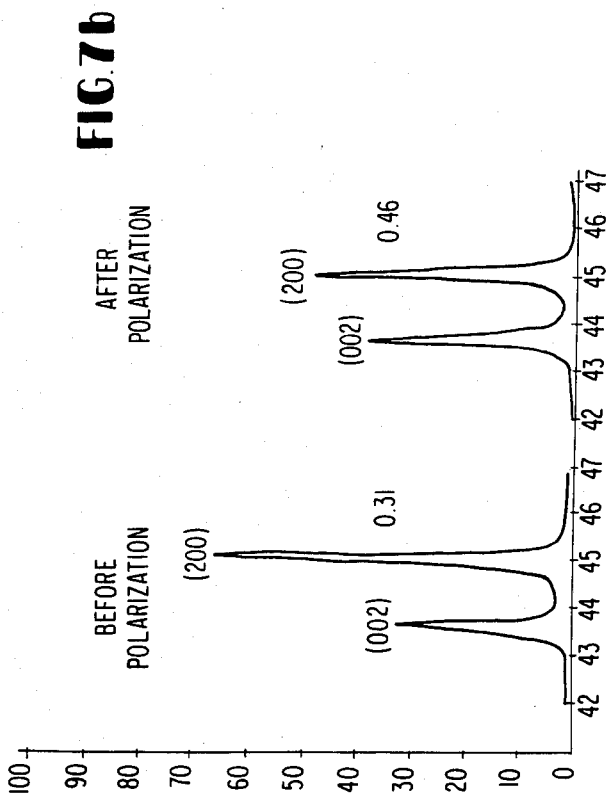
FIG.10
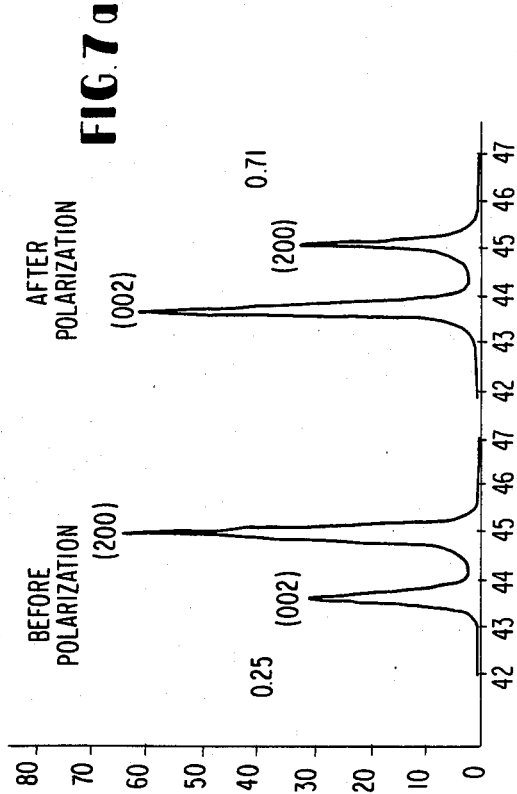
FIG.7a
FIG.7b

|←—→|
45μm        X225

|←—→|
45μm        X225

PIEZOELECTRIC COMPOSITE MATERIAL

This is a continuation of application Ser. No. 112,493, filed Jan. 16, 1980, now abandoned.

BACKGROUND OF THE INVENTION

1. Field of the Invention

The present invention relates to a piezoelectric composite material and more particularly to a piezoelectric composite material comprising a ferroelectric ceramic powder and a polymer.

2. Description of the Prior Art

In general, attempts to obtain piezoelectric materials by compounding polymers and ferroelectric ceramic powders have been known [Mat. Res. Bull., Vol. 13, pp. 599–607 (1978), Pergamon Press Inc. (U.S.A.)]. The ferroelectric ceramic powders have been prepared by carrying out a solid phase reaction under applied heat in the case of preparing titanium-containing ferroelectric ceramics such as $BaTiO_3$, $PbTiO_3$, $PbZrO_3$—$PbTiO_3$ solid solutions and the like; or preparing single crystals in the case of potassium sodium niobate (PSN) and the like, and grinding the product obtained to powders using a grinder such as a ball mill, a vibrational mill or the like until the powders have the desired size distribution. However, ferroelectric ceramic powders prepared by conventional grinding processes are attended by conspicuous difficulties when used in a composite with polymers. That is to say, they barely have even low efficiency which is quite contrary to what one might expect based upon the piezoelectric characteristics of the ferroelectric ceramics themselves, and composite materials of this type are fragile and hard to mold because they lack pliability, moldings thereof are heavy, expensive, etc. As a result, composite materials of this type have not reached the stage of development at which their use is practical.

In the conventional grinding process carried out after the solid phase reaction or the preparation of single crystals, structural fractures arise in the microcrystals of the ceramic which result in the formation of numerous domains or distorted phases. The resulting multiple domains or distorted phases bring on the following problems when the microcrystals are compounded with a polymer. Namely, it becomes almost impossible to force all the resulting numerous multiple domains or distorted phases to line up in the same direction as that of the externally applied electric field even at a high voltage close to the maximum voltage the composite material can resist without dielectric breakdown. The orienting electric field is markedly reduced to several tenths or several hundredths the electric field in the compounding state taking into account the ratio of the dielectric constant of the polymer to that of the ceramics. Thus, admixing of ceramic powders or single crystals with polymers cannot impart piezoelectric properties to an appreciable extent to the resulting composite materials and, consequently, it has scarcely any technical significance.

SUMMARY OF THE INVENTION

Therefore, an object of the present invention is to provide a piezoelectric composite material possessing excellent piezoelectric characteristics in comparison with conventional materials.

The above-described object is attained by compounding a ferroelectric ceramic powder comprising microcrystals having uniform size and virtually a single domain which is prepared by the method described below, and a polymer in particular amounts.

The ferroelectric ceramic powder comprising virtually single domain microcrystals having uniform size can be obtained by the following procedure:

(1) Starting powders are mixed and compounded with one another in amounts corresponding to the composition of a desired ferroelectric ceramic. [In the case of using single crystals such as PSN, solid phase reaction is unnecessary and the powders are used directly in step (3).]

(2) The resulting mixed powder is subjected to a solid phase reaction under applied heat, or to a sintering treatment.

(3) The reaction product or single crystals are ground till the resulting powder has the desired particle size.

(4) The ground product is subjected to heat annealing treatment preferably in air or in an oxygen enriched atmosphere. (Preferably this treatment is repeated two to four times.)

(5) Further, the resulting annealed powder is preferably subjected to a chemical etching treatment.

BRIEF DESCRIPTION OF THE DRAWINGS

FIG. 4(a), FIG. 4(b) and FIG. 5 are scanning electron microscopic photographs of the ferroelectric ceramic powder D, the ferroelectric ceramic powder E, each of which is prepared in accordance with an embodiment of the present invention, and a lead titanate zirconate ceramic powder prepared in a conventional preparation-grinding process, respectively. (Therein, the magnification of the electron microscopic photographs is 5,000×.)

FIG. 7 shows the changes in the intensity of the C-axial plane in X-ray diffraction spectra of ceramic powders incorporated in polymers before and after polarizing treatment, wherein (a) is the X-ray diffraction patterns of the ceramic powder which is the subject of FIGS. 6(a) and (b) is that of a conventional crushed powder for comparison.

FIG. 9 is a schematic cross-sectional diagram illustrating the durability test for piezoelectric rubber sheets, wherein 1 is a rigid ball, 2 is a piezoelectric sheet, 3 is a ground rest, 4 is a buffering rigid plate and 5 is a synchroscope.

FIG. 10 is a graph illustrating the results of the durability test of piezoelectric rubber sheets.

DETAILED DESCRIPTION OF THE INVENTION

Figure 2I:
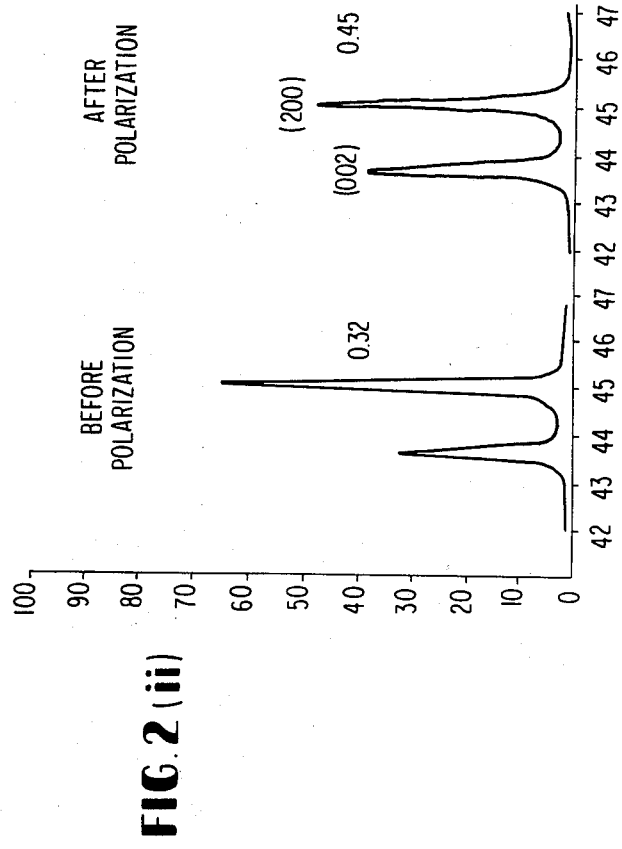
FIG. 2 shows the change in the intensity of the C-axial plane in X-ray diffraction spectra of ceramic powders incorporated in polymers before and after a polarizing treatment, wherein (i) is the X-ray diffraction pattern of the ceramic powder of the present invention and (ii) is that of a conventionally mechanically crushed powder.

While some structural fracture arises in the microcrystals prepared in accordance with the present invention as a result of grinding the powder [procedure (3) described above] which results in the generation of numerous multiple domains or distorted phases, it has been discovered that these multiple domains or distorted phases are reformed by the heat annealing treatment [procedure (4)] and at the same time this treatment gives the individual microcrystals a spherical shape. In addition, the etching treatment [procedure (5)] renders the size of individal microcrystals uniform and the shape thereof still more spherical. Thus, virtually single domain microcrystals having uniform particle size and spherical shape can be prepared in accordance with the present invention.

The starting powders used in making the ferroelectric ceramic used in the present invention should be about 98 wt% or more, preferably about 99 wt% or more pure and have a particle size of about 5$\mu$ or less, preferably about 3$\mu$ or less, more preferably about 1$\mu$ or less. However, where the single crystals are used as the starting material, the particle size is not limited. Heat annealing [procedure (4)] is typically carried out at about 600° to 1,200° C. in an atmosphere having an $O_2$ concentration of about 21% (air) to 100% for about 1 to 30 hours. The treatment is advantageously carried out in a rotary kiln while flowing oxygen thereinto at a rate of about 1 to 20 l/min and repeated 2 to 4 times.

The effect of the etching treatment is thought to be due to the fact that the etching solution acts preferentially at the grain boundaries to remove impurities, foreign matter, defects in the crystal lattice and amorphous phases, most of which are present along the grain boundaries and, furthermore, it causes any secondary particles produced by melt adhesion dissociate and subsequently decompose into single particles.

Namely, since it is inevitable that impurities will invade the ceramic powder in the preparation of starting materials and in the grinding process and will tend to deposit along the grain boundaries, they can be removed to advantage from the ceramic powder using an etching solution. In addition, the etching treatment has such action that the particle surfaces being to have a roundness and super fine particles are dissolved and removed by the etching solution.

Further, along this line, the effects of the etching treatment can be enhanced by stirring or lightly grinding the powder during the etching treatment such as by stirring in a solution. The etching time can be reduced to a great extent when etching is carried out at a high temperature, for instance, under boiling. In any case, the etching treatment should be carried out under such conditions that the etching action is restricted to dissolution of impurities, distorted phases, amorphous phases and super fine particles the removal of all of which is desired; and such that further progress of the etching action, which causes the elution of crystal phases, is repressed and a reduction in piezoelectric properties does not take place.

It is, of course, impractical that all the microcrystals making up the powder obtained by the procedures described above consist of single domains in a strict sense judging from the viewpoint of the quantum statistical theory of matter. Actually, the generation of multiple domains resulting from impurities, structural distortion (such as defects in the lattice, imperfections in the layer structure or the like), or deviations from the stoichiometric ratio and nonuniform composition and, further, external factors such as heat, stress and the like, etc., occurs to some degree. It is a self-evident fact in view of the present level of scientific techniques that a powder consisting of single domain particle cannot be reached. However, in the present invention the number of multiple domains remaining in the microcrystals after the heat annealing procedure as described above or generated therein in the course of stirring or light grinding at the time of the etching procedure are so few in number that the presence of such domains cannot be considered as an important factor inhibiting the orientation of the electric dipoles in individual particles or the orientation thereof in the direction of an electric field applied externally at the time of polarization. Thus, the microcrystals of the present invention can exhibit a unidirectional orientation. Accordingly, the pulverized matter obtained in accordance with the present invention is referred to as "virtually single domain microcrystals" for convenience, and is distinguished from the multiple domain microcrystals obtained by pulverizing single crystals or ceramics prepared under applied heat in a conventional manner which induces structural fractures in the resulting powder and results in the generation of numerous multiple domains and further, distorted phases in the constituent microcrystals of the powder and for which orientation in the direction of an applied electric field is not hardly observed. The expression "single domain microcrystals" is not intended to restrict the present invention to an ideal matter which cannot be manufactured.

The ferroelectric ceramic powders comprising microcrystals having virtually single domains, which are obtained by the above-described procedures, substantially do not contain fine particles having a particle size of about 1$\mu$ or less, but is composed mainly of relatively coarse grains. Preferably the ceramic powder of the present invention contains 90% or more of its grains in a particle size range of about 1$\mu$ to about 3 mm. They may be mixed with various polymers and molded in a desired shape such as a film or a sheet. The molded composite material is first subjected to a cross-linking treatment or to a vulcanizing treatment in case of a rubber system and then to polarization.

The composites of the present invention exhibit especially high ferroelectric properties and excellent piezoelectric characteristics because the electric dipoles of the individual ceramic particles easily align in the direction of the applied field owing to their uniform size and virtually single domains even when the electric field effectively applied to the individual ceramic particles is markedly reduced to several tenths or several hundredths the electric field in the compounded state by the polymer.

Moreover, the thus obtained microcrystals each has a spherical shape as a result of heat annealing and the chemical etching treatments and therefore the crystal-line particles fit the polymers and voids in the composite material almost disappear. The density of the composite material increases and super fine particles are not contained in the composite material when the microcrystals receive the chemical etching treatment. Thus, composite materials possessing high plasticity, high fluidity and consequently, high workability having high density and high performance can be obtained. Further, it becomes possible to obtain very thin sheets of composite materials measuring 15 $\mu$m or so in thickness.

The microcrystals prepared in the present invention having received the heat annealing and optional chemical etching treatments do not have cleaved planes having sharp edges and/or pointed corners as observed in powders prepared in a conventional manner by crushing and grinding. Such being the case, the mechanical strength of the composite materials of the present invention is greatly enhanced and consequently, it becomes possible to provide piezoelectric composite materials suitable for use as mechanical force-electric energy transducers of the type which do not suffer from mechanical damage through repeated application of mechanical force such as impact or tension. Thus, the composite materials obtained by mixing the ferroelectric ceramic powders comprising the single domain microcrystals with polymers can be utilized in the following industrial applications.

Taking into account both the high degree of orientation in the direction of polarization and, further, the monodirectionality inherent in the ferroelectric ceramic powders and good workability of the composite materials, composite materials containing polymers in high mixing amounts are well suited as transducers for inspecting living bodies which require such a high pliability as to be well fitted to the human bodies, and composite materials containing ferroelectric ceramic powders in high mixing amounts are well suited for uses requiring higher piezoelectric properties but whose pliability may be sacrificed to some extent for the piezoelectric properties such as a key board switch made by accumulating a number of switches on a piezoelectric sheet, or the like.

As described above, it is possible to provide a wide variety of composite materials differing in mechanical, electrical and physical characteristics depending upon the end-use desired by varying the mixing ratio of the ceramic powder to polymer and the kinds of the polymers mixed properly and, thereby, apply the composite materials to industrial applications covering a wide area such as mechanical force-electric energy transducers, electricity-sound transducers and pyroelectric materials.

Making an additional remark, in known sheets in which ceramic powders have been incorporated where steps have not been taken in grinding to prevent the generation of multiple domains, polarization is hindered to a great extent as described hereinbefore. Such being the case, it has become necessary to mix a ceramic powder in a large amount in order to satisfy the required efficiency and the ceramic powder and a polymer mix has been difficult to be handled in the preparation of a sheet therefrom due to its hardness, frailness and tendency to be torn. Therefore, such a sheet has been unfit for practical use. On the other hand, the present invention does not always require such a high amount of the ceramic powder (because the ceramic powder can be oriented more efficiently). Therefore, the pliability inherent in the polymer itself can be maintained to advantage and sufficiently high piezoelectric characteristics can be attained in the present invention. Thus, practical use of piezoelectric composite materials possessing both characteristics, namely piezoelectric properties and pliability, can be accomplished only in the present invention.

As to mixing ratios of piezoelectric powders to polymers, ratios below about 1:9 by volume do not exhibit the effect of the ceramic powders. The piezoelectric characteristics increase with an increase in the mixing ratio and particularly, a pronounced increase is observed in the ratio (powder to polymer) of about 55:45 to 90:10. At ratios above about 9:1 the fluidity and the workability of the composite deteriorate markedly and it becomes almost impossible to make moldings therefrom. Accordingly, mixing ratios of powder to polymer ranging from about 1:9 to 9:1 are suitable for most practical uses.

Ferroelectric ceramic powders best suited for the practice of the present invention include component systems of ferroelectric ceramics having one of the following crystal structures, multi-component systems of ferroelectric ceramics having one of the following crystal structures, and ceramics containing the above-described systems as basic components and substituted partially by different elements or modified by the addition of minor components.

1. Perovskite Structures
  (1) Barium titanate and solid solutions containing as the main component barium titanate, with specific examples including $BaTiO_3$, $(Ba, Pb, Ca)TiO_3$, etc.
  (2) Lead titanate and solid solutions containing as the main component lead titanate, for example, $(Pb, La)TiO_3$, $PbTiO_3$—$BiFeO_3$, etc.
  (3) Lead titanate zirconate and solid solutions containing this salt as the main component, for example, $PbZrO_3$—$PbTiO_3$, $PbZrO_3$—$PbSnO_3$—$PbSnO_3$, etc.
  (4) Three-component ceramics consisting of solid solutions containing lead titanate zirconate and as a third component a salt of lead oxide and other metal oxides belonging, for example, one of the following groups (a) to (f):
    (a) Oxides represented by the formula of $A^{2+}(B_{\frac{1}{3}}^{2+}.B_{\frac{2}{3}}^{5+})O_3$ where $A^{2+}$ is Pb, Sr, or Ba; $B^{2+}$ is Zn, Cd, Mg, Ni, or Co; and $B^{5+}$ is Nb or Ta, with specific examples including $Pb(Ni_{\frac{1}{3}}.Nb_{\frac{2}{3}})O_3$, $Pb(Zn_{\frac{1}{3}}.Nb_{\frac{2}{3}})O_3$, $Pb(Co_{\frac{1}{3}}.Nb_{\frac{2}{3}})O_3$, $Pb(Mg_{\frac{1}{3}}.Nb_{\frac{2}{3}})O_3$, etc.
    (b) Oxides represented by the formula of $A^{2+}(B_{\frac{1}{2}}^{2+}.B_{\frac{1}{2}}^{6+})O_3$, where $A^{2+}$ is Pb; $B^{2+}$ is Cd, Mn, Zn, Mg, Co, or Ni; and $B^{6+}$ is W or Te with specific examples including $Pb(Ni_{\frac{1}{2}}.W_{\frac{1}{2}})O_3$, $Pb(Co_{\frac{1}{2}}.W_{\frac{1}{2}})O_3$, etc.
    (c) Oxides represented by the formula of $A^{2+}(B_{\frac{1}{2}}^{3+}.B_{\frac{1}{2}}^{5+})O_3$ where $A^{2+}$ is Pb, Ba, or Ca; $B^{3+}$ is Fe, Sc, Cr, Yb, Lu or In; and $B^{5+}$ is Nb or Ta with specific examples including $Pb(Fe_{\frac{1}{2}}.Nb_{\frac{1}{2}})O_3$, $Pb(Sb_{\frac{1}{2}}.Nb_{\frac{1}{2}})O_3$, $Pb(Y_{\frac{1}{2}}.Nb_{\frac{1}{2}})O_3$, etc.
    (d) Oxides represented by the formula of $A^{2+}(B_{\frac{2}{3}}^{3+}.B_{\frac{1}{3}}^{6+})O_3$ where $A^{2+}$ is Pb; $B^{3+}$ is Fe; and $B^{6+}$ is W, with specific examples including $Pb(Fe_{\frac{2}{3}}.W_{\frac{1}{3}})O_3$.
    (e) Oxides represented by the formula of $A^{3+}(B_{\frac{1}{2}}^{2+}.B_{\frac{1}{2}}^{4+})O_3$ where $A^{3+}$ is La or Nd; $B^{2+}$ is Mg; and $B^{4+}$ is Ti, with specific examples including $La(Mg_{\frac{1}{2}}.Ti_{\frac{1}{2}})O_3$ and $Nd(Mg_{\frac{1}{2}}.Ti_{\frac{1}{2}})O_3$.
    (f) Oxides represented by the formula of $(A_{\frac{1}{2}}^{1+}.A_{\frac{1}{2}}^{3+})BO_3$ where $A^{1+}$ is Na or K; $A^{3+}$ is La, Ce, Nd or Bi; and B is Ti, with specific examples including $(Na_{\frac{1}{2}}.La_{\frac{1}{2}})-TiO_3$, $(K_{\frac{1}{2}}.La_{\frac{1}{2}})TiO_3$, etc.

(5) Solid solutions containing $NaNbO_3$ as the main component, with specific examples including $NaNbO_3$, $(Na-K)NbO_3$, $Na(Ta-Nb)O_3$, etc.

2. Tungsten Bronze Structures

Representative examples include $PbNb_2O_6$, $PbNb_2O_6-PbTa_2O_6$, $PbNb_2O_6-BaNb_2O_6$ and the like.

3. Bismuth Layer Structures

Representative examples include $Bi_4Ti_3O_{12}$, $Bi_4PbTi_4O_{15}$, $Bi_4Sr_2Ti_5O_{18}$ and the like.

4. Others $LiNbO_3$, $LiTaO_3$ and so on.

5. Those ceramics which contain as a basic composition the above one-, two- or three-component systems, wherein a part of the Pb is replaced by an alkaline earth metal(s).

6. Those ceramics which contain as a basic composition the above-described component system, wherein the Pb component is present in excess of the stoichiometric amount.

7. Those ceramics which contain as a basic composition the above-described systems (containing $PbTiO_3$) and further, contain as a supplemental component(s) one or more of oxides selected from the following group I, II or III for the purpose of modification:

I. $Nb_2O_5$, $Ta_2O_5$, $La_2O_3$, $Sb_2O_5$, $Sb_2O_3$, $Bi_2O_3$, $WO_3$, etc.

II. $MgO$, $Fe_2O_3$, $Sc_2O_3$, $K_2O$, etc.

III. $Cr_2O_3$, $U_2O_3$, $MnO_2$, etc.

The composition of ceramic powder employed is selected based on the end-use of the composite material from the above-described basic compositions and compositions analogous thereto, which may be modified by the partial replacement or the addition of certain supplemental components as shown in items 5 to 7 above, taking into account the peculiar properties of the respective compositions, since some compositions are excellent in ferroelectric property, some compositions are excellent in piezoelectric property and other compositions are excellent in pyroelectric property.

Moreover, it becomes feasible to prepare piezoelectric composite materials possessing the improved orientation in the direction of an applied field, which is brought about by controlling the particle size and lowering the strength of the coercive electric field. On the other hand, raising the strength of the coercive electric field makes it possible for piezoelectric composite materials to have high resistance to static load and to have reduced variations with the lapse of time. Polarization can be carried out at 15° C. to the softening point of the polymer using an electric field strength ranging anywhere between 10 and 300 kv/cm. Accordingly, the present invention can contribute to the preparation of piezoelectric composite materials possessing a wide variety of characteristics suitable for various purposes of end-uses.

Specific examples of polymers suitable for mixing with the ceramic powders, particularly ferroelectric ceramics comprising microcrystals having virtually a single domain, include various kinds of rubbers such as natural, synthetic and reclaimed rubbers or blends thereof, particularly fluororubber and chloroprene; and thermoplastic resins such as polyvinylidene fluoride (PVDF), acrylonitrile-butadiene-styrene copolymer (ABS), polyvinyl chloride (PVC), polyvinyl fluoride (PVF) and so on. Polymers having a volume resistivity of about $10^{10}$ ohm.cm or more at room temperature are preferred.

Etching solutions employable in the chemical etching procedure of the present invention may be general acid or alkaline solutions. However, the etching treatment should be carried out under such mild conditions that etching action is restricted to removal of distorted phases and amorphous phases and etching action which causes the elution of the Pb component from the crystal phase and the deterioration of piezoelectric properties is repressed.

Therefore, the etching treatment is carried out preferably using a dilute etching solution. The acid and alkali solutions are generally about 3 to 50 vol% with the pH of the acid solution being about 3 or less and the pH of the alkali solution being about 13 or more. Hydrogen peroxide ($H_2O_2$) can also be used as the etching solution.

If the etching treatment is carried out in a static condition it can take a very long time, such being the case, it is preferred to carry it out at a high temperature, for instance, under a boiling condition, or with stirring or with light grinding with it is carried out at an ordinary temperature from the standpoint of the reduction in time to a great extent. In addition, such an assistant action applied to the etching treatment as boiling, stirring or light grinding results in the advantage that edges of crystal grains become more roundish and the size thereof becomes more uniform through friction and abrasion among the grains.

Suitable etching acids include hydrochloric acid, nitric acid, acetic acid, sulfuric acid, phosphoric acid, hydrofluoric acid or mixtures thereof. Suitable examples of alkalis are sodium hydroxide, potassium hydroxide or mixtures thereof. Specific examples of standard etching conditions are set forth below in Table 1.

TABLE 1

| Ferroelectric Ceramic Powder | Etching Solution | Concentration (vol %) | Temperature | Time (hr) | Condition |
|---|---|---|---|---|---|
| $Pb(Zr-Ti)O_3$ (solid solution) | HCl | 10 | Room Temp. | 3-40 | Mechanical Stirring |
|  | $HNO_3$ | 10 | Room Temp. | 1-15 | Mechanical Stirring |
|  | $CH_3COOH$ | 50 | Room Temp. | 8-100 | Mechanical Stirring |
| $PbTiO_3$ | HCl | 10 | Room Temp. | 3-40 | Mechanical Stirring |
|  | $HNO_3$ | 10 | Room Temp. | 1-15 | Mechanical Stirring |
|  | $CH_3COOH$ | 50 | Room Temp. | 8-100 | Mechanical Stirring |

By raising the etching temperature a further reduction in the time required for etching is possible. The above-described etching treatments are preferably carried out using 100 g of etching solution for 100 g of a ferroelectric ceramic powder.

Figure 1I:
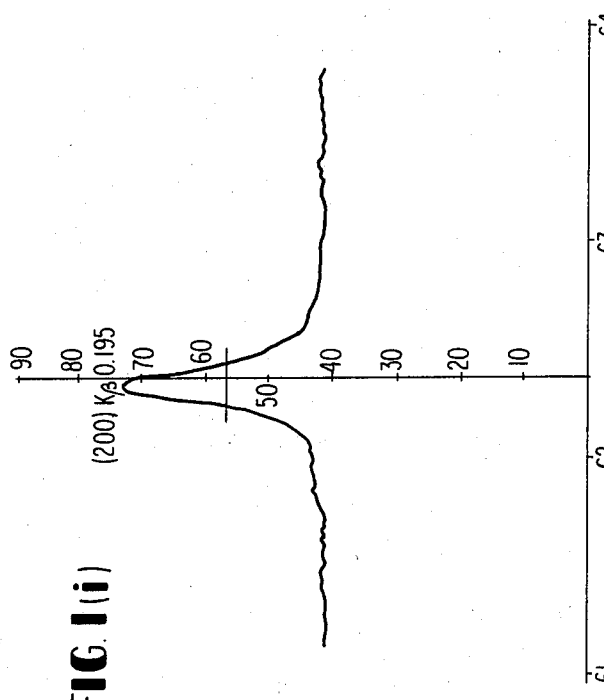
FIG. 1(i) and FIG. 1(ii) are X-ray diffraction patterns of the ceramic powder of the present invention and a conventional crushed powder for comparison, respectively.
Figure 1:
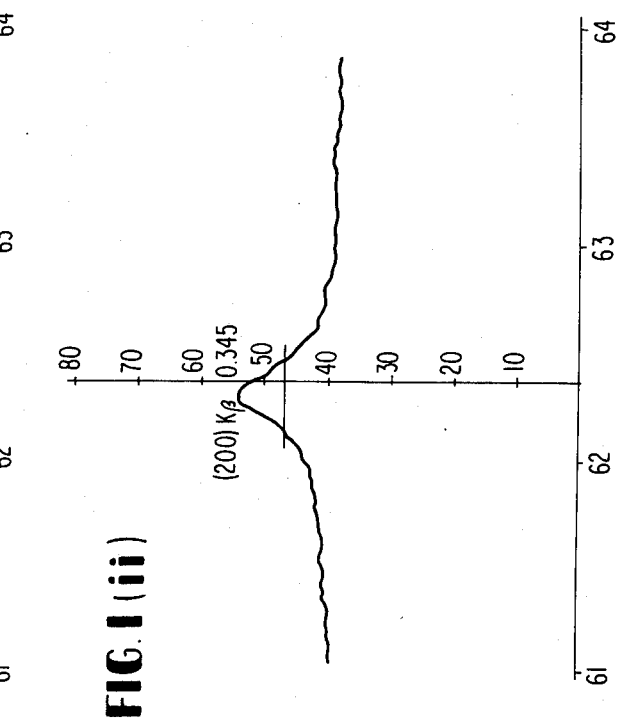

The present invention will now be illustrated in greater detail by reference to the following examples. Unless otherwise indicated, all percentages, parts, ratios and the like are by weight. The X-ray diffraction patterns were obtained in the examples under the following conditions:

| | |
|---|---|
| Target | Cr |
| Filter | FIGS. 1 and 6: None |
| | FIGS. 2 and 7: Ni |
| Voltage | FIGS. 1 and 6: 40 kv |
| | FIGS. 2 and 7: 30 kv |
| Current | FIGS. 1 and 6: 200 mA |
| | FIGS. 2 and 7: 20 mA |
| Full scale | 4,000 cps |
| Time constant | FIGS. 1 and 6: 5 seconds |
| | FIGS. 2 and 7: 2 seconds |
| Goniometer speed | FIGS. 1 and 6: $\frac{1}{4}°$/min |
| | FIGS. 2 and 7: $\frac{1}{8}°$/min |
| Divergent slit | 1° |
| Scatter slit | 1° |
| Image receiving slit | 0.15 mm |

EXAMPLE 1

Commercially available PbO having purity of 99% or higher, WO$_3$ having purity of 99% or higher, ZrO$_2$ having purity of 98.5% or higher and TiO$_2$ having purity of 98% or higher were compounded in their respective amounts corresponding to the composition of Pb(Ti$_{0.5}$—Zr$_{0.5}$)O$_3$+1 wt% WO$_3$ and their respective purities were selected so that the total purity of compounded matter may come to 99% or higher. A 2.5 kg portion of the resulting compound was mixed over a period of 5 hours in a dry condition by means of a vibrational mill. At the time of mixing, contamination with impurities was prevented using a vibrational mill lined with a urethane resin and alumina pebbles. The resulting mixed powder was loaded into a high alumina crucible and it was maintained at a temperature of 730° C. for 4 hours in an atmosphere of PbO to result in the production of Pb(Ti$_{0.5}$—Zr$_{0.5}$)O$_3$+1 wt% WO$_3$ through a solid phase reaction. A 200 g portion of the powder produced, 300 g of alumina pebbles and an appropriate amount of acetone were placed in an alumina ball mill having a volume of 2 liters and therein the grinding treatment was continued for 16 hours.

After drying, the coarse particles were removed from the resulting powder using a screen of 60 mesh and the fine particles remained were divided into two portions. One portion was employed as a ground powder and examined for comparison. The other portion was subjected to a heat annealing treatment using a midget rotary kiln in an atmosphere having an oxygen concentration equal to or higher than that of the air such that the maximum temperature inside the kiln ranged from 800° C. to 950° C., resulting in the preparation of heat annealed powder. The time required for the annealing treatment was about 15 minutes.

The differences in graininess and directionality of microcrystals were examined by X-ray diffraction with respect to the above-described two powders. The results obtained are shown in FIG. 1(i) and FIG. 1(ii). The peak corresponding to K$\beta$ ray from (200) plane has a narrower half width in the heat annealed powder (i) of the present invention in comparison to the ground powder (ii). It can be seen from the diffraction patterns that in powder (i) the crystal lattice has good order and reduced distortion indicating that the powder (i) consists of microcrystals akin to virtually single domain crystals in which the crystal axes are parallely arranged. The half widths of the powder (i) and the powder (ii) were 0.195 and 0.345 degree, respectively.

Each of the powders (i) and (ii) was mixed with polyvinylidene fluoride (PVDF) in a mixing ratio of 3:2 by volume. The resulting composite materials were examined for the difference in the orientation of domains in the direction of an applied electric field and the difference in piezoelectric characteristics. In examining the above-described differences, sample sheets were prepared as follows. Each of the ceramic powders and polyvinylidene fluoride containing 2 wt% of stearic acid as a mold releasing agent were compounded in a 3:2 ratio by volume and mixed using acetone as a solvent. After evaporation of the solvent, the mixture was kneaded by means of an oven roll as heat was applied so as to maintain the temperature at 170° to 180° C. and then rolled into a sheet 0.05 mm thick. The thus obtained sheet was cut into square samples 150 mm long and 100 mm wide.

Figure 2:
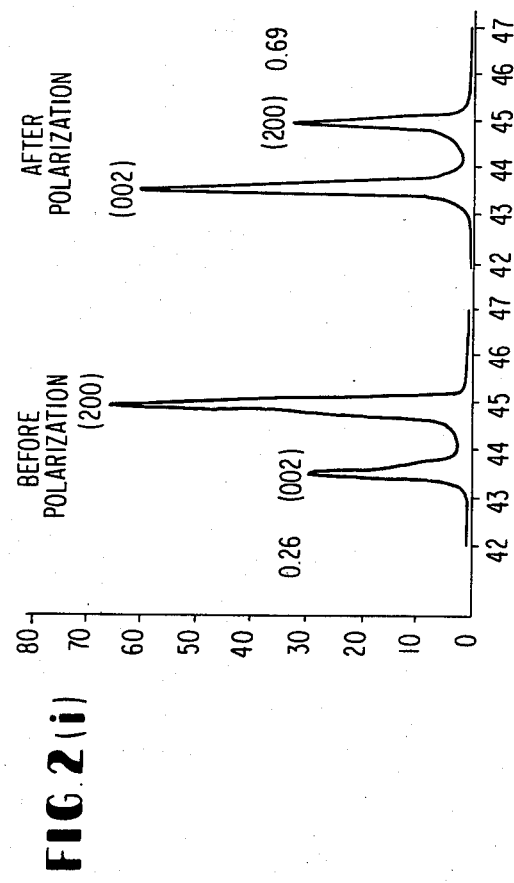

The polarization effect was examined with respect to the rolled sheets of the composite materials prepared using the annealed powder (No. 6 in Table 3) which was heat annealed twice at 950° C. for 2 hours in an oxygen-containing atmosphere ([O$_2$]=38%) and the ground powder for comparison, respectively. X-ray diffraction intensities from (200) and (002) planes on one side of each sample sheet were measured. Then, electrodes were formed on both sides of each sample sheet by vacuum depositing silver in thin layers thereon. Each of the resulting sheets was soaked in a silicone oil heated to a temperature of 100° C., and subjected to a polarizing treatment at 150 kv/cm for 30 minutes. Each of the polarized sheets was examined again for the intensities of X-ray diffractions from (200) and (002) planes. The results are shown in FIG. 2, wherein (i) is the X-ray diffraction spectra of the sample sheet prepared using the annealed powder before and after polarization treatment and (ii) is the X-ray diffraction spectra of the sample sheet prepared using the crushed powder for comparison.

On the basis of this data the intensity ratios of X-ray diffraction spectra of the C-axial plane were calculated for each sample sheet before and after polarization, respectively. The X-ray diffraction intensity ratio of the C-axial plane is defined by the equation of I(002)/[I(002)+I(200)]. Then the increase in the proportion of domains oriented in the direction of the applied electric field through polarization was determined. The results are summarized in Table 2. Therein, the half widths of (200) K$\beta$ peaks of both powders (i) and (ii) are set forth together.

TABLE 2

| | (200)K$\beta$ Half Width ($\Delta 2\theta°$) | Average Grain Size ($\mu$m) | Intensity Ratio[1] | | Increase[3] |
|---|---|---|---|---|---|
| | | | Before[2] | After[2] | |
| Powder (i)- Heat Annealed Powder | 0.195 | 0.9 | 0.26 | 0.69 | 0.43 |
| Powder (ii)- Crushed Powder | 0.345 | 0.9 | 0.32 | 0.45 | 0.13 |

TABLE 3

| | | Annealing Condition | | | | Piezoelectric Power | |
|---|---|---|---|---|---|---|---|
| | | O₂ Atmosphere | | | | | |
| Sample No. | Temp. (°C.) | (l/min) | O₂ Concentration (%) | Number of Times | $\epsilon/\epsilon_0$ | $d_{31}$ ($10^{-12}$ m/V) | $g_{31}$ ($10^{-3}$ V − m/N) |
|---|---|---|---|---|---|---|---|
| 1 | 800 | 2 | 27 | 1 | 93 | 36.1 | 43.9 |
| 2 | 800 | 10 | 45 | 1 | 93 | 32.0 | 38.9 |
| 3 | 950 | In air | 21 | 1 | 97 | 42.0 | 48.9 |
| 4 | 950 | 2 | 25 | 1 | 100 | 43.4 | 49.0 |
| 5 | 950 | 10 | 38 | 1 | 105 | 45.2 | 48.6 |
| 6 | 950 | 10 | 38 | 2 | 110 | 52.8 | 54.2 |
| 7 | 950 | 10 | 38 | 4 | 110 | 52.6 | 54.0 |
| 8 | 950 | 10 | 38 | 8 | 90 | 33.7 | 42.3 |
| Comparison | — | — | — | — | 75 | 11 | 16.6 |

TABLE 2-continued

| | (200)Kβ Half Width (Δ2θ°) | Average Grain Size (μm) | Intensity Ratio[1] Before[2] | Intensity Ratio[1] After[2] | Increase[3] |
|---|---|---|---|---|---|
| for Comparison | | | | | |

[1] With respect to X-ray diffraction from C-axial plane, and defined by I(002)/[I(002) + I(200)].
[2] With regard to polarization.
[3] With respect to proportion of domains oriented in the direction of the electric field after polarization.

Before polarization, the C-axis is generally expected to point along each of the coordinates, X, Y and Z with the same probability. Therefore, the probability of the C-axis pointing to the direction of thickness of the sheet is essentially 0.33. However, lower values were obtained in both sample sheets. It is thought that the value lower than 0.33 can be attributed to the orientation of particles in the direction parallel to the rolled plane through a calender molding for rolling. In case of using the heat annealed powder, the X-ray diffraction intensity ratio changed from 0.26 before to 0.69 after polarization. Namely, remarkable orientation of domains in the direction of the electric field applied for polarization takes place corresponding to an increase of 0.43. On the contrary, in case of using the ground powder for comparison no improvement in orientation of domains occurs for all intents and purposes. That is to say, the ferroelectric ceramic powder in which structural fractures are produced by grinding looses its polarizability through the mixing with the polymer. This is the reason for the failure to attain the expected piezoelectric porperty.

The sample sheet was further cut into pieces 20 mm wide and 70 mm long and the electric capacity thereof was measured with a universal bridge of 1 V and 1 KHz. From the data obtained the dielectric constant $\epsilon/\epsilon_0$ (wherein $\epsilon_0 = 8.854 \times 10^{-12} F/m$) was calculated. A weight of 45 g was attached to each of the sample pieces and at the same time a sine wave of 40 Hz was applied thereto at 100 V/mm. Elongation arose in the sample piece which was measured with a differential transformer. From the thus obtained data, a piezoelectric strain constant, $d_{31} = t/V \times \Delta l/l$ (m/V) was determined with respect to each sample piece. Thus, a piezoelectric output constant, $g_{31} = d_{31}/\epsilon_0 \cdot \epsilon (V - m/N)$ which is the standard value for an efficiency test could be calculated. The results of these measurements with respect to various annealed powders differing in preparation such as annealing temperature, atmosphere and the number of treatments are summarized in Table 3.

As can be seen from Table 3 the most pronounced annealing effect and consequently the most excellent characteristics could be attained at annealing temperatures of 950° C. or so, in an oxygen enriched atmosphere and preferably the annealing treatment was repeated from 2 to 4 times. If the annealing treatment is repeated 8 or more times defects in the lattice and melt adhesion among particles occur due to evaporation of PbO resulting in the deterioration of the piezoelectric property.

In any case, the piezoelectric strain constant $d_{31}$, the piezoelectric output constant $g_{31}$ and the dielectric constant of the ceramic powder heat annealed in accordance with the present invention were enhanced 3 to 5 times, 2.3 to 3.3 times and 1.2 to 1.5 times, respectively, compared with those of the ground ceramic powder for comparison.

EXAMPLE 2

Pb(Ti$_{0.5}$—Zr$_{0.5}$)O$_3$ + 1 wt% WO$_3$ was prepared in the same manner as in Example 1. 200 g portion of the ceramic powder prepared, 300 g of alumina pebbles and a proper quantity of acetone were placed in an alumina ball mill having a volume of 2 liters and grinding was continued for 8 hours. The thus obtained powder is named powder (i).

After drying the powder (i) obtained through the grinding process, coarse particles were removed therefrom using a screen of 60 mesh and the remaining portion of powder (i) was subjected to the annealing treatment using a midget rotary kiln in an atmosphere having an oxygen concentration higher than or equal to that of air such that the maximum temperature inside the kiln ranged from 800° to 950° C. at an annealing time of 15 minutes.

Water was added to glacial acetic acid of special reagent grade in a mixing ratio by volume of 1:1 to prepare a dilute solution employable as an etching solution. 100 ml portion of the powder having received the heat annealing treatment was placed in a 300 ml beaker and thereto the above-described etching solution was added to make the total volume 200 ml. The resulting suspension was subjected to an etching treatment under the following various conditions.

A sample powder was first prepared for etching by subjecting the powder (i) to the annealing treatment twice at a temperature of 950° C. in an oxygen enriched atmosphere ([O$_2$] = 38%) supplied at a flow rate of 10 l/min and divided into five portions. Each portion was subjected to etching treatment under conditions (a) to (e) below, respectively. The resulting powder samples are designated powders A to E in relation to the respective etching conditions (a) to (e). Further, other powders F and G were prepared under the same etching condition as (b) using annealed powders differing in the annealing condition.

Etching Conditions:

(a) 8 hours' etching with 8 hours' stirring by means of a magnetic stirrer.

(b) 24 hours' etching with both 8 hours' stirring and 16 hours' rest in the etching solution.

(c) 48 hours' etching with both 8 hours' stirring and 40 hours' rest in the etching solution.

(d) 96 hours' etching with both 8 hours' stirring and 88 hours' rest in the etching solution.

(e) 3 hours' etching accompanied by mechanical grinding. (The mechanical grinding was carried out by placing 100 g of the powder having received the annealing treatment and 150 g of alumina pebbles of 18 mm $\phi$ into a 500 ml container made of a resin, pouring the etching solution thereinto so as to make the volume of the content 300 ml, sealing the container and then setting the container to a revolving machine rotating at 100 rpm.)

Annealing Conditions:

(f) Annealing at a temperature of 800° C. in an atmosphere containing 27% $O_2$ is supplied into the kiln at a flow rate of 2 l/min.

(g) Annealing at a temperature of 950° C. in air.

Each of powders treated under the above-described conditions was dried to prepare the respective powders A to G.

For the purpose of comparison, a powder H which had received the heat annealing treatment but was not etched, and a powder I which received only the grinding treatment were also employed.

Figure 3:
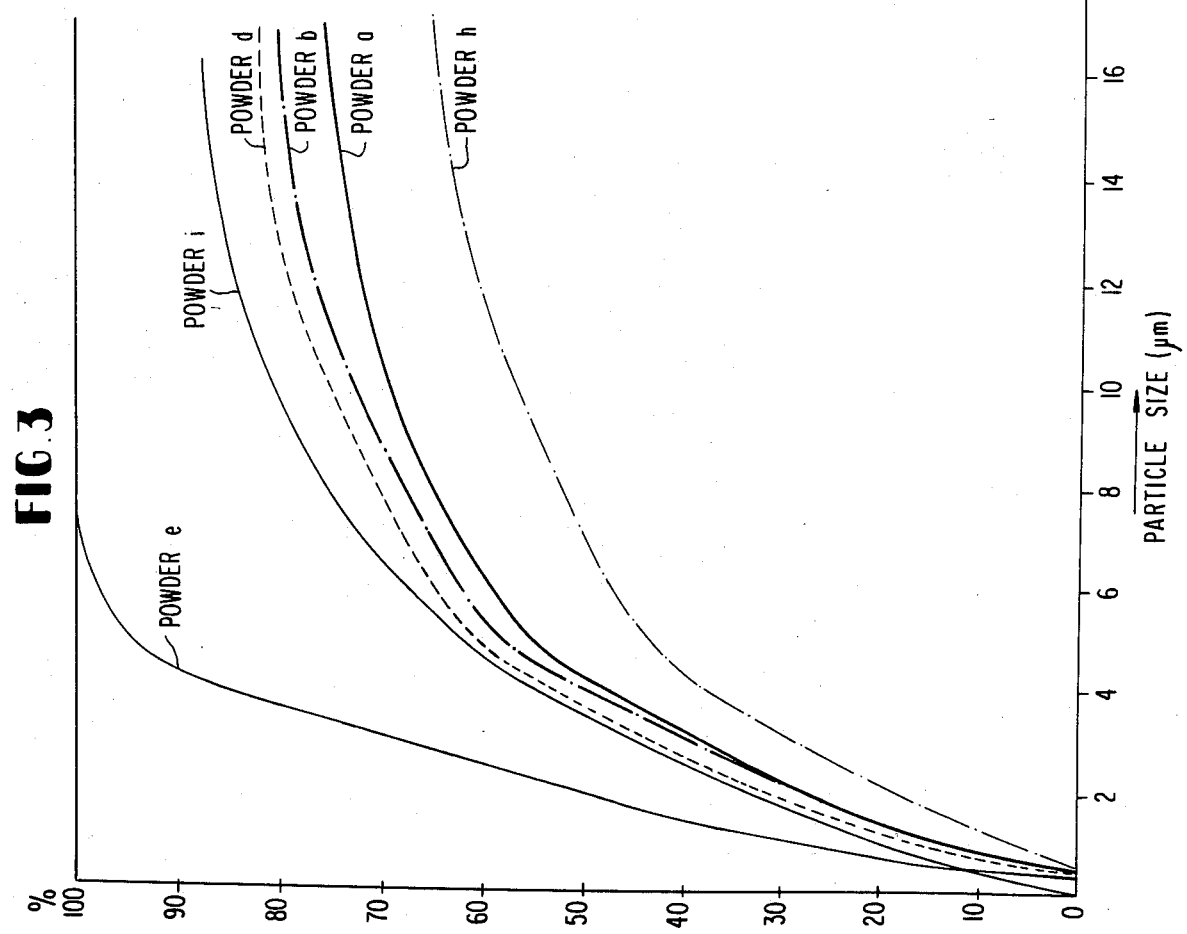

Accumulated grain size distribution of each of the above-described powders (except for the powders C, F and G) is shown in FIG. 3. The measurement was carried out in a dispersion prepared by dispersing each powder into a 0.05% of sodium pyrophosphate aqueous solution. At the same time the average diameters of the powders were measured using a specific surface area measuring means. The data obtained is set forth in Table 5 below. In FIG. 3, it is worth noting that the particle size of the ground powder becomes once coarse due to aggregation through the annealing treatment and then it approaches the original value through various etching treatments and it becomes finer than the original when the etching treatment is accompanied by light grinding. This is due to the aggregation of fine particles through the heat annealing and the consequent formation of secondary particles, as clarified hereinafter by observations using magnified photographs. Even if the orderliness of the distorted phases can be realized by annealing, the annealing is accompanied by the aggregation phenomenon. Therefore, it is not possible to disperse homogeneously the grains existing in such an aggregative state into a polymer by only mixing and for this reason it is inferred that close and highly efficient piezoelectric composite materials are difficult to obtain. If these secondary particles are ground, they separate into individual, original particles to a certain extent, but the piezoelectric property is spoiled by the strain caused by grinding. Thereupon, the chemical etching comes in to exhibit its effect in separating the secondary grains into individual original grains without an appreciable reduction in piezoelectric property.

Figure 4A:
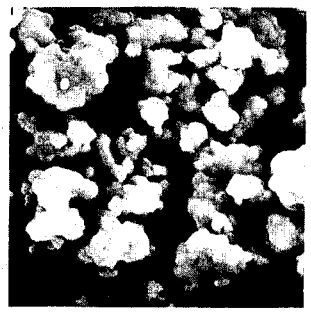
Figure 4B:
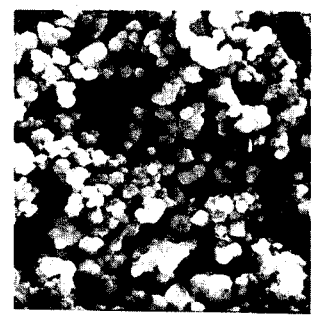

As can be seen from the scanning type electron microscope photographs (magnification: 5,000×) of powder D and powder E shown in FIG. 4(a) and FIG. 4(b), respectively, it can be observed that the secondary particles formed by melt adhesion among particles constituting ferroelectric ceramic powders are allowed to disaggregate into simple microcrystals with still greater efficiency by subjecting the powder to the etching treatment accompanied by stirring or light mechanical grinding.

In addition, since the chemical etching possesses not only a secondary particle disaggretating action but also dissolves the surface of the individual particles, the particle size tends to gradually decrease. It is also found out that the average diameter of the particles decreases with increases in the etching time and in the strength of mechanical force applied for disaggregation of secondary particles. Especially, in the case of the powder E obtained through the etching treatment accompanied by grinding with a rotary mill, particles having a size of 7 $\mu$m or more disappeared completely and only simple fine particles and small secondary particles having a size of 7 $\mu$m or less appeared, as can be seen from FIG. 4(b).

In addition, the etching treatment enables dissolution of super fine particles having sizes below sub-$\mu$m (though the ground powder (i) contains such super fine particles in a proportion of about 10%), as apparent from FIG. 3 which illustrates the difference in particle size distributions between the powder (i) and the powders A to E having received the etching treatments. The dissolution of super fine particles contained in the powder improves the properties of the composite materials. Improved plasticity and fluidity and, consequently, good workability are also advantages inherent in the chemical etching treatment and should not be overlooked.

Figure 5:
FIG. 5 is the graph of particle size distribution, in which the particle size distribution of the ferroelectric ceramic powder comprising virtually single domain microcrystals prepared by the present invention is compared with ceramic powders prepared in the same manner except that the chemical etching treatment is omitted and with ceramic powders prepared in a conventional crushing process, respectively.

On the other hand, FIG. 5 is the scanning type electron microscope photograph (magnification: 5,000×) of an Nb added lead titanate zirconate ceramic powder obtained through preparation and grinding (for 16 hours). The powder pulverized only through mechanical grinding and left without receiving any further treatment was practically composed of finely crushed pieces formed by mechanical grinding. Therefore, the cleaved planes of crushed pieces had sharp blade-like edges. When a composite material prepared by mixing finely crushed pieces of ceramic with a pliant polymer is deformed by externally applied force, sharp edges or points in the crushed pieces tend to cause mechanical destruction of the polymer; for instance, partial cutting or boring of the polymers takes place in the composite material. Such a phenomenon is responsible for the disadvantages that the composite material is hard and fragile and lacks mechanical strength.

On the other hand, the etching treatment accompanied by light mechanical grinding possesses great advantages. It does not give rise to crushed pieces since it pulverizes the heat annealed powder following the mechanism that an etching solution can permeate deep into the interior of particle boundaries through cracks generated by weak mechanical force applied externally to the vetrified particle boundaries, which are formed by melt adhesion of simple particles and thereby the glass phase which is readily dissolvable in acid can be dissolved by the etching solution and consequently the dissociation and the subsequent decomposition into simple particles takes place. Further, it can provide spherical particles since chemical etching tends to dissolve preferentially sharp edges and corners with acute angles.

Accordingly, such disadvantages as observed in conventional piezoelectric ceramic powders are greatly reduced in the piezoelectric ceramic powders of the present invention. Namely, by virtue of the spherical shape of particles the mechanical strength of the composite material is increased, the particles fit the polymers well, the charging density of the particles into the polymer increases and voids almost disappear from the composite material. Therefore, it becomes possible to provide a high density composite material containing the ceramic powder in large mixing amount and to increase the piezoelectric characteristics corresponding to the increased amount of the particles.

Figure 6A:
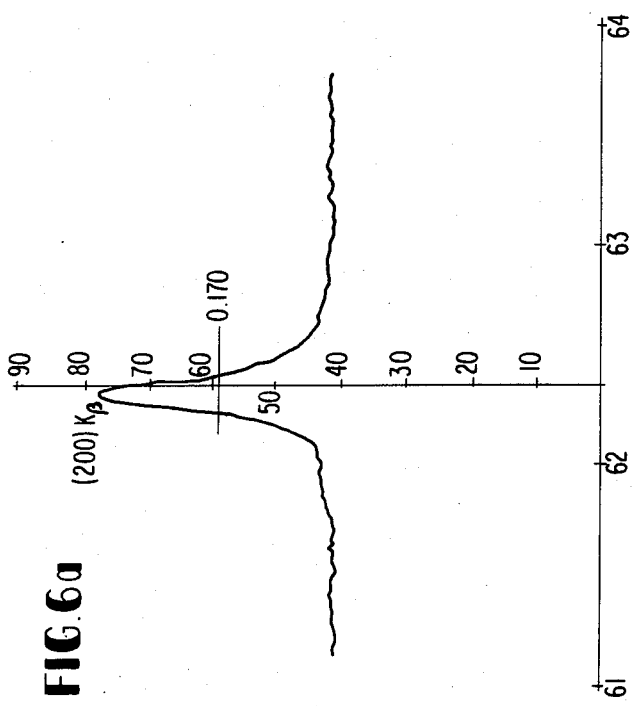
FIG. 6(a) and FIG. 6(b) are X-ray diffraction patterns of ceramic powders prepared in accordance with another embodiment of the present invention and a conventional crushed powder for comparison.
Figure 6B:
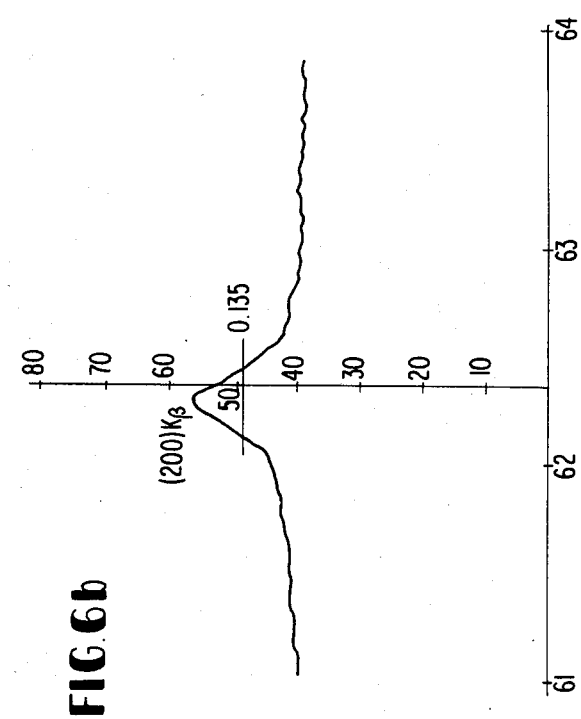

The internal difference between these powders were examined by X-ray diffraction. The spectra obtained are shown in FIG. 6(a) and FIG. 6(b). The chemically etched powder B of the present invention had a narrower half width with respect to the peak corresponding to $K\beta$ ray from (200) plane than ground powder (i) for comparison. It can be seen from the difference in line width that in powder B the crystal lattice is arranged in good order and has reduced distortion which indicates that powder B comprising microcrystals similar to single crystals having single domains in which the crystal axes are parallel. The half widths of powder B and powder (i) were 0.170 degree and 0.315 degree, respectively.

Each of powders B and (i) was mixed with the polymer comprising polyvinylidene fluoride (PVDF) in a mixing ratio of 3:2. The resulting composite materials were examined for the difference in the orientation of the domains in the direction of an applied electric field and the difference in piezoelectric characteristics. Preparation of composite materials are described hereinafter.

X-ray diffraction intensities from the (200) and (002) planes on one side of the sample sheet were measured. With respect to the sample sheet (prepared as in Example 1) of the composite material prepared using the powder (Powder No. 2 in Table 6), which received both the heat annealing treatment twice at 950° C. for 2 hours in a 38% oxygen-containing atmosphere, and was chemically etched using an acetic acid aqueous solution for 24 hours (8 hours stirring and 16 hours at rest in the acetic acid aqueous solution). Then, electrodes were formed on both sides of the sample sheet by vacuum depositing silver in thin layers. The resulting sheets were soaked in a silicone oil heated to 100° C., followed by polarizing treatment at 150 kv/cm and 30 minutes. The polarized sheet was examined again for the intensities of the X-ray diffractions from the (200) and (002) planes. The results of the measurements are shown in FIG. 7(a). Further, the same measurements were carried out using the finely crushed powder (i) for comparison, and the results of these measurements are shown in FIG. 7(b).

On the basis of this data, the intensity ratios of X-ray diffraction spectra of the C-axial plane of each sample sheet before and after polarization, respectively, which is defined by the equation of $I(002)/[(002)+I(200)]$, were calculated. Then, the increase in proportion of domains oriented in the direction of the applied electric field through polarization was determined. The results are summarized in Table 4. Therein, the half widths of (200) $K\beta$ peaks of both powders B and (i) are set forth together.

TABLE 4

|  | (200)$K\beta$, Half Width ($\Delta 2\theta°$) | Average Grain Size ($\mu$m) | Intensity Ratio[1] | | |
|---|---|---|---|---|---|
|  |  |  | Before[2] | After[2] | Increase[3] |
| Etched Powder | 0.170 | 1.7 | 0.25 | 0.71 | 0.46 |
| Crushed Powder (for comparison) | 0.315 | 1.3 | 0.31 | 0.46 | 0.15 |

[1]With respect to X-ray diffraction from C-axial plane, and defined by $I(002)/[I(002) + I(200)]$.
[2]With regard to polarization. Again before values lower than 0.33 can be attributed to the orientation of the particles through calender rolling.
[3]With respect to proportion of domains oriented in the direction of the electric field after polarization.

In the case of the composite material prepared using the heat annealed and chemically etched powder, the X-ray diffraction intensity ratio changed from 0.25 before to 0.71 after polarization. Remarkable orientation of domains in the direction of the electric field after polarization took place in a proportion corresponding to the increase of 0.46. On the contrary, in case of the composite material prepared using the ground powder for comparison no improvement in orientation of domains did occur in a practical sense. That is to say, the ferroelectric ceramic powder which is composed of particles having multiple domains or distorted phases generated by structural fractures resulting from grinding loses its polarizability upon mixing with the polymer.

In case of the powder H which did not receive any etching treatments, coarse particles having sizes of 15 $\mu$m or larger still remained in a proportion of 35%, as is apparent from the size distribution curve in FIG. 3. Therefore, when the composite material containing the powder H was rolled in a film 0.025 mm thick, boring due to the existence of such coarse particles and perforations resulting from the release of such coarse particles arose throughout the film. Electrodes provided on both sides of the film using an evaporating technique or the like short-circuited. Thereupon, it was not possible to polarize such a film and consequently it was also impossible to render such a film piezoelectric. Such being the case, it is necessary to double the thickness of the film (0.050 mm or over) to utilize the powder H. However, films having a thickness of 0.050 mm or more are hard and heavy and therefore they are not suitable as electricity-sound transducing films in headphones, speakers and the like, or as pyroelectric films having high sensitivity and rapid response.

On the other hand, in the etching treatment, which is optionally accompanied by mechanical grinding, coarse particles formed by melt adhesion are separated into simple fine particles and those with sharp edges and corners are preferentially dissolved in the etching solution and thereby the resulting simple particles tend to have a spherical shape. Therefore, even when composite materials containing powders having received some etching treatment are molded into a thin film having a thickness ranging from 0.015 mm to 0.025 mm, holes hardly arose in such films, and piezoelectric films possessing sufficient piezoelectric property for practical use could be manufactured.

Figure 8A:
FIG. 8(a) and FIG. 8(b) are microscopic photographs (magnification: 225×) comparing the surface properties of composite materials containing an etched ceramic powder and a ceramic powder which was not etched, respectively.
Figure 8B:
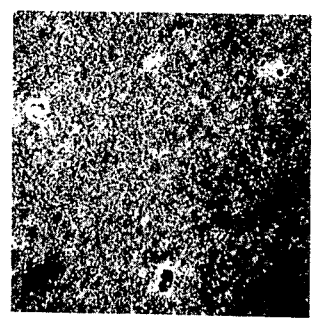

Of these powders, the powder E contained no coarse particles measuring 7 $\mu$m or more in size at all. Therefore, the composite material containing the powder E as a ceramic powder component could be molded in a very thin film 0.015 mm thick without suffering from the generation of undesirable holes. The microscopic photograph of this film (magnification: 225×) is shown in FIG. 8(a). As can be seen from the photograph, no pinholes were observed and a surface of good quality could be obtained. On the other hand, the microscopic photograph of the film molded using powder H is shown in FIg. 8(b). Therein, a number of pinholes due to the presence of coarse particles were observed. Thus, in the case powder E was used and the resulting composite material could be molded to a film having a thickness near that of a film made of resin alone and the resulting film could exhibit piezoelectric characteristics (on the basis of constant $d_{31}$) higher than that of the resin film by a factor of about 2.

Next, electrodes were formed on both sides of each of the thus obtained films by vacuum depositing silver in thin layers and then each of the resulting films was soaked in a silicone oil heated to a temperature of 100° C., and subjected to a polarizing treatment at 150 kv/cm and 30 minutes.

In addition, a monoaxially stretched film of PVDF which contained no ceramic powder at all was prepared for the purpose of comparison and subjected to a polarization treatment under the same conditions as described above.

Dielectric constant $\epsilon/\epsilon_0$ and piezoelectric constants $d_{31}$ and $g_{31}$ were determined in the same manner as in Example 1. The data obtained is summarized in Table 5.

The longer the duration of the etching treatment under a static condition is, not only the larger is the proportion of the layers from which impurities, defects in the lattice or amorphous phases are removed, but also the more spherical the resulting particles become because the edges of the particles disappear as the particles gradually become small little by little by dissolving the surface of the particles. Consequently, the resulting particles are more suitable for compounding with polymers.

Comparing powder A subjected to only 8 hours' stirring in the etching solution with powder D subjected to not only 8 hours' stirring in the etching solution but also the subsequent 8 hours' rest in the etching solution, each particle in powder D was, on the whole, slightly smaller than each particle in powder A as is apparent from FIG. 3, and the average diameter of particles in powder A and that of particles in powder D were 1.8 μm and 1.7 μm, respectively. Moreover, the piezoelectric constant $d_{31}$ of the composite material containing powder D was slightly improved, compared with that of the composite material containing the powder A lacking in rest time. Accordingly, it is possible to improve the piezoelectric property of the composite material by the use of the ceramic powder subjected to an appropriate etching treatment.

However, since solutions of the kind which do not affect adversely the properties of the materials prepared by compounding with polymers are employed as an etching solution for ceramic powders, there exist sometimes cases in which it is difficult to dissociate and de-

TABLE 5

| Sample No. | Powder | Heat Annealing Condition | | | | Etching Condition | | |
|---|---|---|---|---|---|---|---|---|
| | | Anneal Temp. (°C.) | $O_2$ Atmosphere | | Number of Annealing Times | Time for Etching (hr) | Stirring or Grinding (hr) | Rest (hr) |
| | | | (l/min) | $O_2$ Concentration (%) | | | | |
| Invention 1 | A | 950 | 10 | 38 | 2 | 8 | 8 Stirring | 0 |
| Invention 2 | B | 950 | 10 | 38 | 2 | 24 | 8 Stirring | 16 |
| Invention 3 | C | 950 | 10 | 38 | 2 | 48 | 8 Stirring | 40 |
| Invention 4 | D | 950 | 10 | 38 | 2 | 96 | 8 Stirring | 88 |
| Invention 5 | E | 950 | 10 | 38 | 2 | 24 | 3 Grinding | 0 |
| Invention 6 | F | 800 | 2 | 27 | 1 | 24 | 8 Stirring | 16 |
| Invention 7 | G | 950 | In air | 21 | 1 | 24 | 8 Stirring | 16 |
| Invention 8 | H | 950 | 10 | 38 | 2 | 0 | No etching treatment | |
| Comparison 9 | I | No anneal treatment | | | | 0 | No etching treatment | |
| Comparison 10 | J | PVDF monoaxially elongated film | | | | | | |

| Sample No. | Thickness of Mold (mm) | Dielectric Constant | Piezoelectric[1] Strain Constant | Piezoelectric[2] Output Constant | Average Particle Size (μm) |
|---|---|---|---|---|---|
| Invention 1 | 0.025 | 93.0 | 52.7 | 64.0 | 1.8 |
| Invention 2 | 0.025 | 97.9 | 60.2 | 69.5 | 1.7 |
| Invention 3 | 0.025 | 90.2 | 53.4 | 66.9 | 1.7 |
| Invention 4 | 0.025 | 91.2 | 53.6 | 66.4 | 1.7 |
| Invention 5 | 0.015 | 92.4 | 51.0 | 62.3 | 1.1 |
| Invention 6 | 0.025 | 83.0 | 43.3 | 58.9 | 1.4 |
| Invention 7 | 0.025 | 86.6 | 50.4 | 65.8 | 1.7 |
| Invention 8 | 0.025 | Impossible to mold due to holes | | | 1.9 |
| | 0.050 | 90.3 | 48.2 | 60.3 | |
| Comparison 9 | 0.025 | Impossible to mold due to crumbling | | | 1.3 |
| | 0.050 | 73.7 | 9.5 | 14.6 | |
| Comparison 10 | 0.009–0.030 | 13 | 20 | 174 | — |

[1] $d_{31}$ (× $10^{-12}$ m/V)
[2] $g_{31}$ (× $10^{-3}$ V · m/N)

It is seen from the results regarding the piezoelectric constant $d_{31}$ that a great improvement in piezoelectric property can be realized if the duration of the etching and the etching conditions are properly selected, as observed in the case of the powder B.

compose the secondary particles generated by aggregation and melt adhesion into their original simple particles only by soaking in the etching solution. In such cases, the secondary particles disaggregate readily with the aid of externally applied mechanical force.

For instance, powder E corresponds to the case in which the annealed powder was ground for 3 hours using a rotary mill and soaked in the etching solution. Therein, though the secondary particles generated by melt adhesion still remained in a small proportion, there were no coarse particles measuring 7 μm or over in diameter and most of the secondary particles were disaggregated into simple particles. Therefore, an excellent powder having uniform particle size, as illustrated in FIG. 3, could be obtained.

However, the generation of multiple domains and distortion in crystal particles caused by the combined use with mechanical grinding at the time of the etching treatment are unavoidable and thereby a deterioration in piezoelectric property can arise to an extent proportional to the strength of the grinding force. Therefore, on the occasion of the combined use of the etching treatment and mechanical grinding, it is important to select appropriate mild grinding conditions and to be carried out without detracting from the piezoelectric property.

The thus obtained powder does not have any cleaved planes having blade-like edges and pointed corners, which are observed in conventional crushed and ground powders and, therefore, the powder can be mixed more densely with a polymer and a composite material having fewer voids can be obtained. Thus, highly efficient piezoelectric materials can be obtained and the mechanical strength thereof can be increased to a great extent. Consequently, it becomes possible to modify the composite materials so as to make them suitable for a variety of applications as mechanical force-electric energy transducers of the kind which do not suffer from mechanical damage through repeated application of impact stress as described hereinafter.

A piezoelectric composite sheet (No.2) prepared in accordance with an embodiment of the present invention and a piezoelectric sheet (No.9) prepared in a conventional manner each was subjected to a durability test in which a load was weighted repeatedly on the sampel sheet, as illustrated in FIG. 9. The results obtained are illustrated in FIG. 10.

As illustrated schematically in FIG. 9, each of sample sheets No.2 and No.9 was cut to prepare a sample piece 2 having an area of one square centimeter and a thickness of 0.5 mm, and sandwiched between the ground rest 3 and the buffering rigid plate 4 (polyvinyl chloride plate 1 mm thick) and thereonto a rigid ball 1 having weight of 11.8 g was allowed to fall repeatedly from the height of 10 cm. Output potential of each samples was measured using a synchroscope 5 every falling. The average value of 10 sheets of each sample are plotted in the graph of FIG. 10.

As shown in the graph of FIG. 10, the conventional sheet No.9 broke down by the application of load repeated 700,000 times on an average and on the contrary, the piezoelectric sheet No.2 of the present invention could function normally even after the application of load repeated 3,000,000 times and that no deterioration in output potential was observed therein.

As described above, in accordance with embodiments of the present invention, piezoelectric composite materials possessing both high piezoelectric characteristics inherent in ferroelectric ceramic and pliability inherent in polymer can be obtained.

While the invention has been described in detail and with reference to specific embodiments thereof, it will be apparent to one skilled in the art that various changes and modifications can be made therein without departing from the spirit and scope thereof.

What is claimed is:

1. A ferroelectric, pyroelectric or piezoelectric composite material comprising a mixture of one or more polymers and a ferroelectric ceramic powder which contains 90% or more grains in a particle size range of about 1 μm to about 3 mm at a ceramic powder: polymer(s) mixing ratio of about 1:9 to 9:1 by volume, said ferroelectric ceramic powder comprising microcrystals having virtually single domains and being prepared by mixing starting powders in amounts corresponding to the desired chemical composition of the ferroelectric ceramic powder, subjecting the mixed powders to a solid phase reaction, mechanically grinding the reaction product into powder, whereby multiple domains or distorted phases are formed, and then heat annealing the ground powder at a temperature sufficient to reform the multiple domains or distorted phases to virtually single domains.

2. The composite material of claim 1, wherein said heat annealing is carried out at about 600° to 1200° C. in air or in an atmosphere having an $O_2$ concentration of about 21% to 100% for about 1 to 30 hours.

3. The composite material of claim 1, wherein said polymer is a natural rubber or a synthetic rubber or a thermoplastic resin.

4. The composite material of claim 1, wherein said heat-annealing treatment is carried out 2 to 4 times.

5. The composite material of claim 1, wherein said ferroelectric ceramic powder contains as a basic composition the following one-, two or three-component systems:

I. Perovskite structures selected from (1) to (5);
(1) barium titanate and solid solutions containing as the main component barium titanate;
(2) lead titanate and solid solutions containing as the main component lead titanate;
(3) lead titanate zirconate and solid solutions containing this salt as the main component;
(4) three-component ceramics consisting of solid solutions containing lead titanate zirconate and as a third component a salt of lead oxide and other metal oxides belonging to one of the following groups (a) to (f):
(a) oxides represented by the formula:

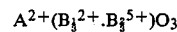

where $A^{2+}$ is Pb, Sr or Ba; $B^{2+}$ is Zn, Cd, Mg, Ni or Co and $B^{5+}$ is Nb or Ta;
(b) oxides represented by the formula:

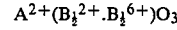

where $A^{2+}$ is Pb; $B^{2+}$ is Cd, Mn, Zn, Mg, Co or Ni and $B^{6+}$ is W or Te;
(c) oxides represented by the formula:

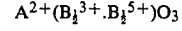

where $A^{2+}$ is Pb, Ba or Ca; $B^{3+}$ is Fe, Sc, Cr, Yb, Lu or In and $B^{5+}$ is Nb or Ta;
(d) oxides represented by the formula:

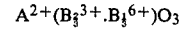

wherein $A^{2+}$ is Pb; $B^{3+}$ is Fe and $B^{6+}$ is W;

(e) oxides represented by the formula:

$$A^{3+}(B_{\frac{1}{2}}^{2+}.B_{\frac{1}{2}}^{4+})O_3$$

wherein $A^{3+}$ is La or Nd; $B^{2+}$ is Mg and $B^{4+}$ is Ti;

(f) oxides represented by the formula:

$$(A_{\frac{1}{2}}^{1+}.A_{\frac{1}{2}}^{3+})BO_3$$

wherein $A^{1+}$ is Na or K; $A^{3+}$ is La, Ce, Nd or Bi and B is Ti; and (5) solid solutions containing $NaNbO_3$;

II. tungsten bronze structures;

III. bismuth layer structures;

IV. $LiNbO_3$ or $LiTaO_3$;

ceramics which containing as a basic composition the above one-, two- or three-component systems, wherein a part of the Pb is replaced by an alkaline earth metal(s);

ceramics which contain as a basic composition the above one-, two- or three-component systems and further contain, as a supplemental component, one or more oxides selected from the following groups I, II or III for the purpose of modification:

I. $Nb_2O_5$, $Ta_2O_5$, $La_2O_3$, $Sb_2O_5$, $Sb_2O_3$, $Bi_2O_3$ and $WO_3$;

II. $MgO$, $Fe_2O_3$, $Sc_2O_3$ and $K_2O$; and

III. $Cr_2O_3$, $U_2O_3$ and $MnO_2$; and ceramics which contain as a basic composition the above-described one-, two- or three-component systems, wherein the Pb component is present in excess of the stoichiometric amount.

6. A ferroelectric, pyroelectric or piezoelectric composite material comprising a mixture of one or more polymers and a ferroelectric ceramic powder which contains 90% or more grains in a particle size range of about 1 μm to about 3 mm at a ceramic powder: polymer(s) mixing ratio of about 1:9 to 9:1 by volume, said ferroelectric ceramic powder comprising microcrystals having virtually single domains and being prepared by mixing starting powders in amounts corresponding to the desired chemical composition of the ferroelectric ceramic powder, subjecting the mixed starting powders to a solid phase reaction, mechanically grinding the reaction product into powder, whereby multiple domains or distorted phases are formed, then heat annealing the ground powder at a temperature sufficient to reform the multiple domains or distorted phases to virtually single domains, and further subjecting the annealed powder to chemical etching in an etching solution under mild conditions such that the distorted phases and amorphous phases present are removed.

7. The composite material of claim 6, wherein said chemical etching treatment is accompanied by stirring or light grinding.

8. The composite material of claim 6, wherein said heat annealing is carried out at about 600° to 1200° C. in air or in an atmosphere having an $O_2$ concentration of about 21% to 100% for about 1 to 30 hours.

9. The composite material of claim 6, wherein said polymer is a natural rubber or a synthetic rubber or a thermoplastic resin.

10. The composite material of claim 6, wherein said heat-annealing treatment is carried out 2 to 4 times.

11. The composite material of claim 6, wherein etching is carried out using an acid or alkali solution having a pH of about 3 or less or about 13 or more, respectively, or using hydrogen peroxide.

12. The composite material of claim 6, wherein said ferroelectric ceramic powder contains as a basic composition the following one-, two or three-component systems:

I. Perovskite structures selected from (1) to (5):

(1) barium titanate and solid solutions containing as the main component barium titanate;

(2) lead titanate and solid solutions containing as the main component lead titanate;

(3) lead titanate zirconate and solid solutions containing this salt as the main component;

(4) three-component ceramics consisting of solid solutions containing lead titanate zirconate and as a third component a salt of lead oxide and other metal oxides belonging to one of the following groups (a) to (f):

(a) oxides represented by the formula:

$$A^{2+}(B_{\frac{1}{3}}^{2+}.B_{\frac{2}{3}}^{5+})O_3$$

where $A^{2+}$ is Pb, Sr or Ba; $B^{2+}$ is Zn, Cd, Mg, Ni or Co and $B^{5+}$ is Nb or Ta;

(b) oxides represented by the formula:

$$A^{2+}(B_{\frac{1}{2}}^{2+}.B_{\frac{1}{2}}^{6+})O_3$$

where $A^{2+}$ is Pb; $B^{2+}$ is Cd, Mn, Zn, Mg, Co or Ni and $B^{6+}$ is W or Te;

(c) oxides represented by the formula:

$$A^{2+}(B_{\frac{1}{2}}^{3+}.B_{\frac{1}{2}}^{5+})O_3$$

where $A^{2+}$ is Pb, Ba or Ca; $B^{3+}$ is Fe, Sc, Cr, Yb, Lu or In and $B^{5+}$ is Nb or Ta;

(d) oxides represented by the formula:

$$A^{2+}(B_{\frac{2}{3}}^{3+}.B_{\frac{1}{3}}^{6+})O_3$$

wherein $A^{2+}$ is Pb; $B^{3+}$ is Fe and $B^{6+}$ is W;

(e) oxides represented by the formula:

$$A^{3+}(B_{\frac{1}{2}}^{2+}.B_{\frac{1}{2}}^{4+})O_3$$

wherein $A^{3+}$ is La or Nd; $B^{2+}$ is Mg and $B^{4+}$ is Ti;

(f) oxides represented by the formula:

$$(A_{\frac{1}{2}}^{1+}.A_{\frac{1}{2}}^{3+})BO_3$$

wherein $A^{1+}$ is Na or K; $A^{3+}$ is La, Ce, Nd or Bi and B is Ti; and (5) solid solutions containing $NaNbO_3$;

II. tungsten bronze structures;

III. bismuth layer structures;

IV. $LiNbO_3$ or $LiTaO_3$;

cermaics which containing as a basic composition the above one-, two- or three-component systems, wherein a part of the Pb is replaced by an alkaline earth metal(s);

ceramics which contain as a basic composition the above one-, two- or three-component systems and further contain, as a supplemental component, one or more oxides selected from the following groups I, II or III for the purpose of modification:

I. $Nb_2O_5$, $Ta_2O_5$, $La_2O_3$, $Sb_2O_5$, $Sb_2O_3$, $Bi_2O_3$ and $WO_3$;

II. MgO, Fe$_2$O$_3$, Sc$_2$O$_3$ and K$_2$O; and

III. Cr$_2$O$_3$, U$_2$O$_3$ and MnO$_2$; and ceramics which contain as a basic composition the above-described one-, two- or three-component systems, wherein the Pb component is present in excess of the stoichiometric amount.

13. A ferroelectric, pyroelectric or piezoelectric composite material comprising a mixture of one or more polymers and ferroelectric single crystal powder which contains 90% or more grains in a particle size range of about 1 μm to about 3 mm at a single crystal powder: polymer(s) mixing ratio of about 1:9 to 9:1 by volume, said ferroelectric single crystal powder comprising microcrystals having virtually single domains and being prepared by grinding a single crystal until the resulting powder has the desired particle size, whereby multiple domains or distorted phases are formed, and heat annealing the thus ground powder at a temperature sufficient to reform the multiple doamins or distorted phases to virtûally single domains.

14. The composite material of claim 13, wherein said heat annealing is carried out at about 600° to 1200° C. in air or in an atmosphere having an O$_2$ concentration of about 21% to 100% for about 1 to 30 hours.

15. The composite material of claim 13, wherein said polymer is a natural rubber or a synthetic rubber or a thermoplastic resin.

16. The composite material of claim 13, wherein said heat-annealing treatment is carried out 2 to 4 times.

17. A ferroelectric, pyroelectric or piezoelectric composite material comprising a mixture of one or more polymers and a ferroelectric single crystal powder which contains 90% or more grains in a particle size range of about 1 μm to about 3 mm at a single crystal powder: polymer(s) mixing ratio of about 1:9 to 9:1 by volume, said ferroelectric single crystal powder comprising microcrystals having virtually single domains and being prepared by grinding a single crystal until the resulting powder has the desired particle size, whereby multiple domains or distorted phases are formed, heat annealing the thus ground powder at a temperature sufficient to reform the multiple domains or distorted phases to virtually single domains and further subjecting the annealed powder to chemical etching in an etching solution under mild conditions such that the distorted phases and amorphous phases present are removed.

18. The composite material of claim 17, wherein said chemical etching treatment is accompanied by stirring or light grinding.

19. The composite material of claim 17, wherein said heat annealing is carried out at about 600° to 1200° C. in air or in an atmosphere having an O$_2$ concentration of about 21% to 100% for about 1 to 30 hours.

20. The composite material of claim 17, wherein said polymer is a natural rubber or a synthetic rubber or a thermoplastic resin.

21. The composite material of claim 17, wherein said heat-annealing treatment is carried out 2 to 4 times.

22. The composite material of claim 17, wherein etching is carried out using an acid or alkali solution having a pH of about 3 or less or about 13 or more, respectively, or using hydrogen peroxide.

* * * * *